(12) United States Patent
Tsai et al.

(10) Patent No.: US 11,823,832 B2
(45) Date of Patent: Nov. 21, 2023

(54) ALERT SYSTEM FOR TRANSFORMER

(71) Applicant: National Taipei University of Technology, Taipei (TW)

(72) Inventors: Shun-Hung Tsai, Taipei (TW); Men-Shen Tsai, Taipei (TW); Kuan-Wei Ko, Taipei (TW)

(73) Assignee: NATIONAL TAIPEI UNIVERSITY OF TECHNOLOGY, Taipei (TW)

(*) Notice: Subject to any disclaimer, the term of this patent is extended or adjusted under 35 U.S.C. 154(b) by 526 days.

(21) Appl. No.: 17/109,699

(22) Filed: Dec. 2, 2020

(65) Prior Publication Data
US 2022/0148799 A1 May 12, 2022

(30) Foreign Application Priority Data
Nov. 11, 2020 (TW) .................. 109139288

(51) Int. Cl.
| | | |
|---|---|---|
| H01F 27/40 | (2006.01) | |
| G01R 31/62 | (2020.01) | |
| G01J 5/02 | (2022.01) | |
| G08B 21/18 | (2006.01) | |
| G06N 20/00 | (2019.01) | |
| G01J 5/53 | (2022.01) | |

(Continued)

(52) U.S. Cl.
CPC ............ H01F 27/402 (2013.01); G01J 5/027 (2013.01); G01J 5/53 (2022.01); G01R 31/62 (2020.01); G06N 20/00 (2019.01); G08B 21/182 (2013.01); G08B 21/185 (2013.01); G08B 21/187 (2013.01); G01J 5/48 (2013.01); G01J 2005/0077 (2013.01); H01F 2027/406 (2013.01)

(58) Field of Classification Search
CPC .. H01F 27/402; H01F 2027/406; G01J 5/027; G01J 5/53; G01J 5/48; G01J 2005/0077; G01J 5/0096; G01J 5/52; G01R 31/62; G06N 20/00; G08B 21/182; G08B 21/185; G08B 21/187
See application file for complete search history.

(56) References Cited

U.S. PATENT DOCUMENTS 9,948,872 B2 * 4/2018 Frank .................. H04N 23/57
10,670,572 B2 * 6/2020 Chadha ............ G01N 15/0656
11,497,405 B2 * 11/2022 Abreu .................. A61B 5/002

(Continued)

FOREIGN PATENT DOCUMENTS

| TW | I676009 B | 11/2019 |
|---|---|---|
| TW | M595226 U | 5/2020 |

*Primary Examiner* — Tung S Lau
(74) *Attorney, Agent, or Firm* — Birch, Stewart, Kolasch & Birch, LLP (57) ABSTRACT

An alert system for a transformer includes a thermographic camera configured to capture thermal images of the transformer, a current sensor configured to generate a sensor signal indicating the current magnitude of a current outputted from the transformer, a storage configured to store a machine learning model, an alert device, and a processing unit configured to obtain image temperature values from the thermal images, obtain magnitude values from the sensor signal, obtain normal temperature values by using the machine learning model and the magnitude values, and instruct the alert device to deliver an alerting signal based on a result of comparison between the image temperature values and the normal temperature values.

16 Claims, 4 Drawing Sheets

(51) Int. Cl.
 *G01J 5/00* (2022.01)
 *G01J 5/48* (2022.01)

(56) References Cited

U.S. PATENT DOCUMENTS

| | | | |
|---|---|---|---|
| 2008/0165248 A1* | 7/2008 | Wang | H04N 25/63 |
| | | | 348/76 |
| 2008/0166072 A1* | 7/2008 | Wang | H04N 23/56 |
| | | | 382/312 |
| 2015/0105687 A1* | 4/2015 | Abreu | A61F 7/00 |
| | | | 600/549 |
| 2018/0206730 A1* | 7/2018 | Abreu | A61B 5/4812 |
| 2019/0277822 A1* | 9/2019 | Chadha | G01N 33/0031 |

* cited by examiner

ALERT SYSTEM FOR TRANSFORMER

CROSS-REFERENCE TO RELATED APPLICATION

This application claims priority of Taiwanese Invention Patent Application No. 109139288, filed on Nov. 11, 2020.

FIELD

The disclosure relates to an alert system, and more particularly to an alert system for transformers.

BACKGROUND

A factory that manufactures, for example, semiconductor devices and electronic panels demands a large amount of electric power from a high voltage source or an ultra-high voltage source, and therefore usually has its own electrical transformers dedicated for operation of the factory. When sudden malfunction of any of the transformers occurs, the subsequent electric power outage not only stops production for quite a while, but also brings about a large number of defective products, causing a huge loss to the company.

SUMMARY

There is a need to monitor operation of transformers and to issue early warning of a detected potential or upcoming failure of the transformers, so that managers of the transformers may shift workload of defective transformers to normal transformers and/or schedule maintenance of the defective transformers in advance, thereby avoiding the huge loss that may otherwise be caused by sudden malfunction of the transformers.

Therefore, an object of the disclosure is to provide alert systems for transformers that enable early warning of transformer failures.

According to one aspect of the disclosure, an alert system for a transformer includes a thermographic camera, a current sensor, a storage, an alert device, and a processing unit that is electrically connected to the thermographic camera, the current sensor, the storage and the alert device. The thermographic camera is configured to capture thermal images of the transformer at different time points which are regular intervals apart. Each of the thermal images includes a first region that corresponds to a main body of the transformer, a second region that corresponds to an exposed portion of a core of the transformer, and a third region that corresponds to at least one air outlet of the transformer, wherein the first region, the second region and the third region are non-overlapping with each other. The current sensor is configured to continuously measure current magnitude of a current outputted from the transformer, and generate a sensor signal indicating the current magnitude over a time period during which the current magnitude was measured.

The storage is configured to store a machine learning model. The processing unit is configured to receive the thermal images from the thermographic camera, and store the thermal images into the storage. The processing unit is configured to receive the sensor signal from the current sensor, obtain, based on the sensor signal, magnitude values of the current magnitude measured at the different time points which are within the time period and at which the thermal images were captured, and store the magnitude values thus obtained into the storage. The processing unit is configured to, for each of the thermal images thus received, obtain a set of image temperature values including a first image temperature value, a second image temperature and a third image temperature with respect to the first region, the second region and the third region of thermal image, respectively, based on temperature information contained in the thermal image. The processing unit is further configured to, for an object thermal image of the thermal images received from the thermographic camera, obtain a first normal temperature value, a second normal temperature value and a third normal temperature value that correspond respectively to the first region, the second region and the third region of the object thermal image by using, as inputs to the machine learning model, N number of sets of image temperature values that are obtained for a batch of thermal images that includes N number of the thermal images that were captured by the thermographic camera immediately before the object thermal image is being captured, and N+1 number of the magnitude values that are associated with the object thermal image and the batch of thermal images, wherein N is a positive integer greater than 1. The processing unit is further configured to, for the object thermal image, compare the first image temperature value, the second image temperature value and the third image temperature value obtained for the object thermal image respectively with the first normal temperature value, the second normal temperature value and the third normal temperature value thus obtained. The processing unit is further configured to, for the object thermal image, instruct the alert device to deliver an alerting signal under any of circumstances of: the first image temperature value obtained for the object thermal image exceeding the first normal temperature value by a first offset that exceeds a predetermined threshold; the second image temperature value obtained for the object thermal image exceeding the second normal temperature value by a second offset that exceeds the predetermined threshold; and the third image temperature value obtained for the object thermal image exceeding the third normal temperature value by a third offset that exceeds the predetermined threshold.

According to another aspect of the disclosure, an alert system for a three-phase transformer, which includes a first transformer, a second transformer and a third transformer, includes a thermographic camera, a first current sensor, a second current sensor, a third current sensor, a storage, an alert device, and a processing unit that is electrically connected to the thermographic camera, the first through third current sensors, the storage and the alert device. The thermographic camera is configured to, at an object time point, capture a first thermal image of the first transformer, a second thermal image of the second transformer and a third thermal image of the third transformer. Each of the first thermal image, the second thermal image and the third thermal image includes a first region that corresponds to a main body of the respective one of the first transformer, the second transformer and the third transformer, a second region that corresponds to an exposed portion of a core of the respective one of the first transformer, the second transformer and the third transformer, and a third region that corresponds to at least one air outlet of the respective one of the first transformer, the second transformer and the third transformer, wherein the first region, the second region and the third region are non-overlapping with each other. The first current sensor is configured to continuously measure current magnitude of a current outputted from the first transformer, and generate a first sensor signal indicating the current magnitude over a time period during which the current magnitude was measured. The second current sensor is configured to continuously measure, current magnitude of a current outputted from the second transformer, and generate a second sensor signal indicating the current magnitude over the time period during which the current magnitude was measured. The third current sensor is configured to continuously measure current magnitude of a current outputted from the third transformer, and generate a third sensor signal indicating the current magnitude over the time period during which the current magnitude was measured. The storage is configured to store a machine learning model. The processing unit is configured to receive the first thermal image, the second thermal image and the third thermal image from said thermographic camera, and store the first thermal image, the second thermal image and the third thermal image into said storage. The processing unit is configured to receive the first sensor signal, the second sensor signal and the third sensor signal from the first current sensor, the second current sensor and the current sensor, respectively, obtain, based on the first sensor signal, a first magnitude value of the current magnitude measured at the object time point which is within the time period and at which the first thermal image was captured, obtain, based on the second sensor signal, a second magnitude value of the current magnitude measured at the object time points which is within the time period and at which the second thermal image is captured, obtain, based on the third sensor signal, a third magnitude value of the current magnitude measured at the object time point which is within the time period and at which the third thermal image is captured, and store the first magnitude value, the second magnitude value and the third magnitude value into said storage. The processing unit is configured to, for each thermal image of the first thermal image, the second thermal image and the third thermal image thus received, obtain a set of image temperature values including a first image temperature value, a second image temperature value and a third image temperature value with respect to the first region, the second region and the third region of the thermal image, respectively, based on temperature information contained in the thermal image. The processing unit is further configured to, for the third thermal image, obtain a first normal temperature value, a second normal temperature value and a third normal temperature value that correspond respectively to the first region, the second region and the third region of the third thermal image by using, as inputs to the machine learning model, the first magnitude value associated with the first thermal image, the second magnitude value associated with the second thermal image, the third magnitude value associated with the third thermal image, and the sets of image temperature values obtained respectively for the first thermal image and the second thermal image. The processing unit is further configured to, for the third thermal image, compare the first image temperature value, the second image temperature value and the third image temperature value that are obtained for the third thermal image respectively with the first normal temperature value, the second normal temperature value and the third normal temperature value. The processing unit is further configured to, for the third thermal image, instruct the alarm device to deliver an alerting signal under any of circumstances of: the first image temperature value obtained for the third thermal image exceeding the first normal temperature value by a first offset that exceeds a predetermined threshold; the second image temperature value obtained for the third thermal image exceeding the second normal temperature value by a second offset that exceeds the predetermined threshold; and the third image temperature value obtained for the third thermal image exceeding the third normal temperature value by a third offset that exceeds the predetermined threshold.

BRIEF DESCRIPTION OF THE DRAWINGS

Other features and advantages of the disclosure will become apparent in the following detailed description of the embodiment (s) with reference to the accompanying drawings, of which:

FIGS. 5 and 6 show a flowchart illustrating operations of an alert system for a transformer according to an embodiment of the disclosure; and FIGS. 7 and 8 show a flowchart illustrating operations of an alert system for a three-phase transformer according to an embodiment of the disclosure.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 1:
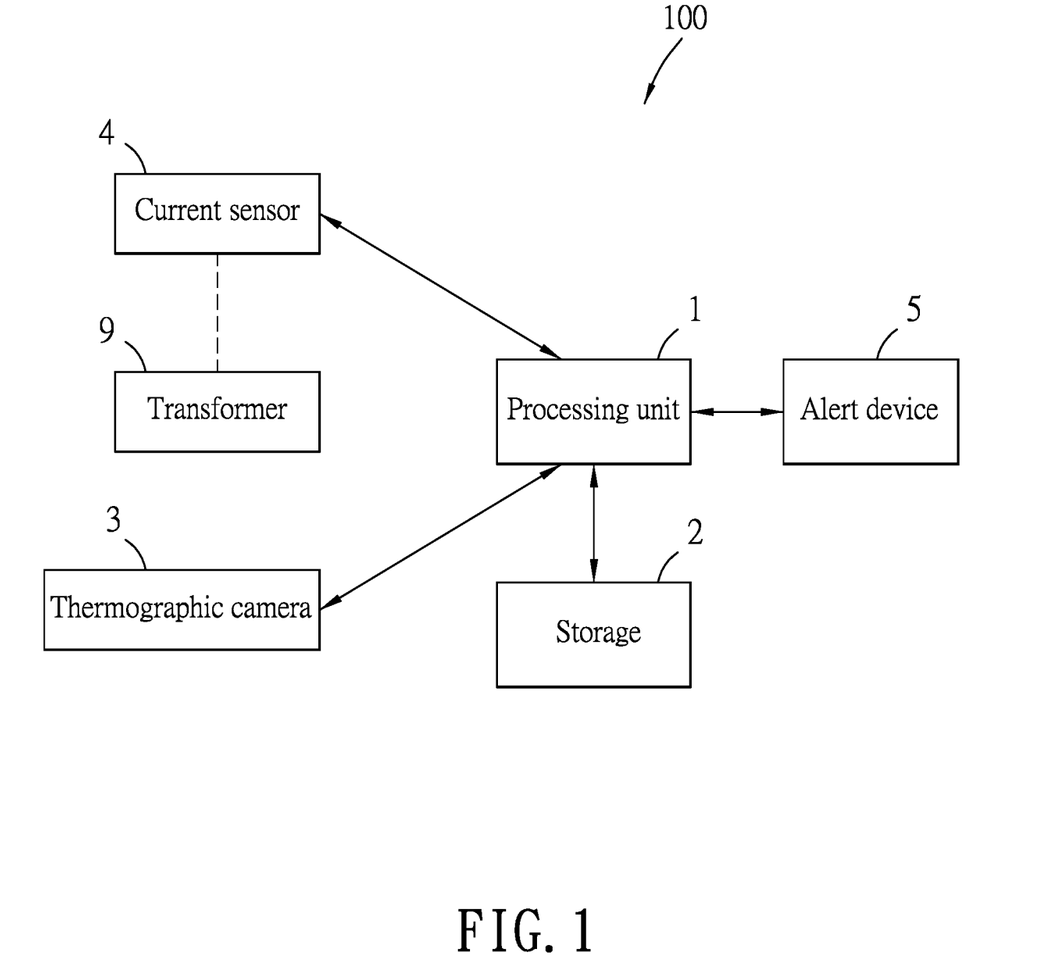
FIG. 1 is a block diagram that exemplarily illustrates an alert system for a transformer according to an embodiment of the disclosure.

FIG. 1 exemplarily illustrates an alert system 100 for a transformer 9 according to an embodiment of the disclosure. The system 100 includes a processing unit 1, and a storage 2, a thermographic camera 3, a current sensor 4 and an alert device 5 that are each in wired or wireless communication with the processing unit 1 (e.g., through electrical connections). The processing unit 1 may be implemented by, for example, a central processing unit (CPU), a processor, a system on a chip (SoC) or a computer host, but the disclosure is not limited thereto.

The storage 2 is configured to store a machine learning model, and may be implemented by, for example, a hard disk drive (HDD), a solid-state drive (SSD), non-volatile memory, or other memory devices. The machine learning model may be established by, for example, the gated recurrent units (GRU) technique, the convolutional neural network (CNN) technique or the partial least squares (PLS) regression technique. The thermographic camera 3 is positioned facing the transformer 9, and is configured to capture thermal images of the transformer 9 at different time points that are regular intervals apart, and to send the thermal images thus captured to the processing unit 1. According to an embodiment of the disclosure, the regular interval may have a length of thirty seconds, but the disclosure is not limited thereto.

Figure 2:
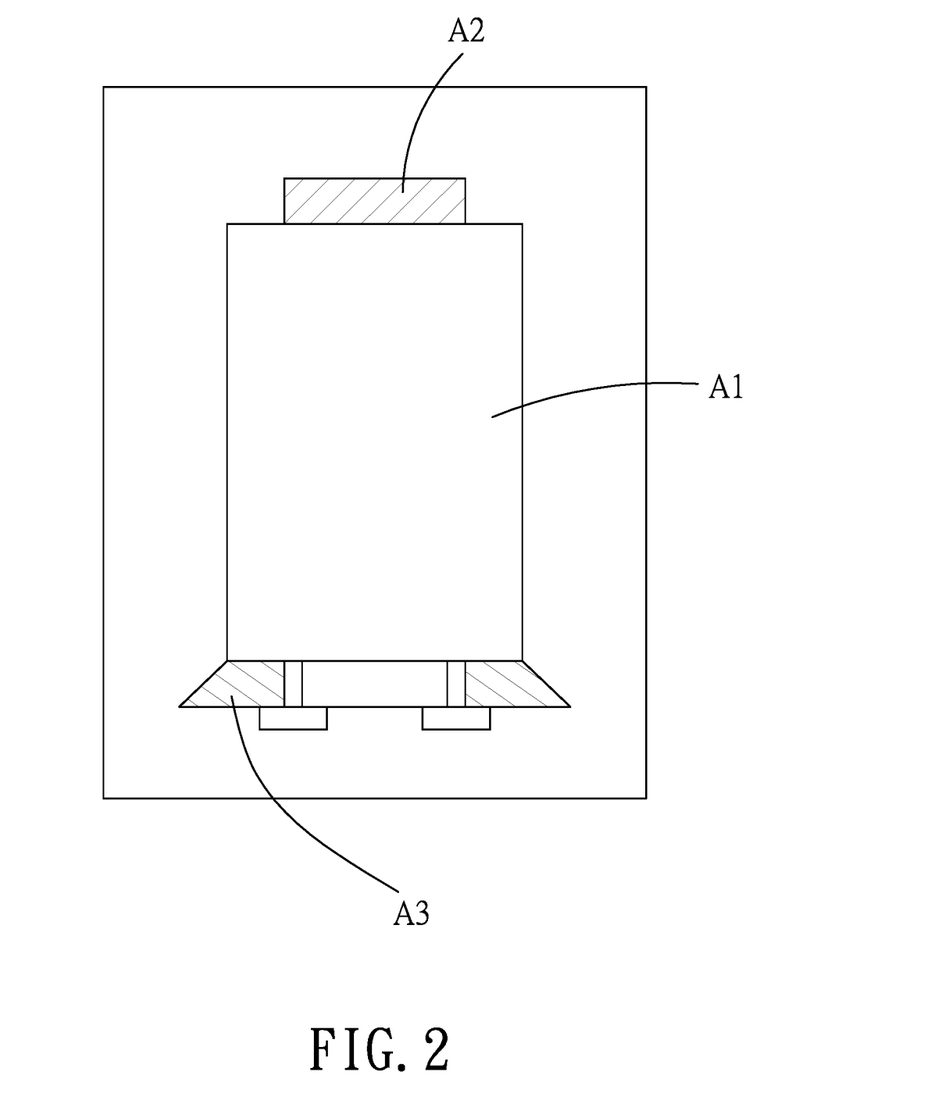
FIG. 2 is a schematic diagram that exemplarily illustrates a thermal image according to an embodiment of the disclosure.
Figure 3:
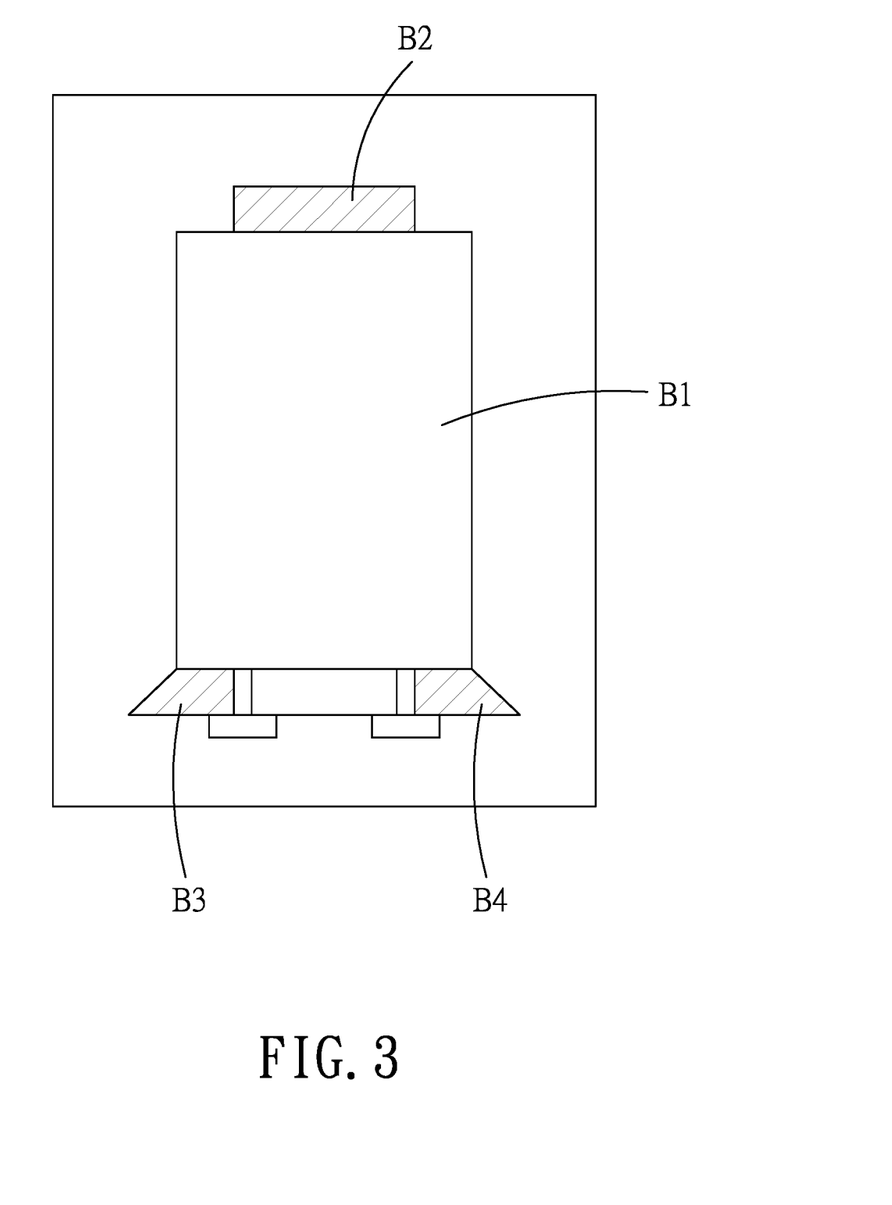
FIG. 3 is a schematic diagram that exemplarily illustrates another thermal image according to an embodiment of the disclosure.

The transformer 9 may include a main body which has coils in its interior, at least one core (a portion of which is exposed outside of the main body), and at least one air outlet which is disposed for heat dissipation. The number of core(s) and the number of air outlet(s) of the transformer 9 may vary. For example, in an embodiment, the transformer 9 that is monitored by the system 100 has one core and two air outlets; in another embodiment, the transformer 9 has two cores and six air outlets. When the transformer 9 is working, temperature of the core(s) and the air outlet(s) is usually higher than temperature of the main body. The thermal images captured and sent by the thermographic camera 3 each include plural regions that do not overlap each other and that correspond to plural portions of the transformer 9, wherein the portions include the main body, at least one exposed portion of the at least one core and the at least one air outlet of the transformer 9. An example thermal image of the transformer 9 that includes three regions is schematically illustrated in FIG. 2. The thermal image shown in FIG. 2 includes a first region A1 that corresponds to the main body of the transformer 9, a second region A2 that corresponds to an exposed portion of a core of the transformer 9, and a third region A3 that corresponds to two air outlets of the transformer 9. Another example thermal image of the transformer that includes four regions is schematically illustrated in FIG. 3. The thermal image shown in FIG. 3 includes a first region B1 that corresponds to the main body of the transformer 9, a second region B2 that corresponds to an exposed portion of a core of the transformer 9, a third region B3 that corresponds to an air outlet of the transformer 9, and a fourth region B4 that corresponds to another air outlet of the transformer 9.

The current sensor 4 is configured to continuously measure magnitude of a current outputted from the transformer 9 (namely, current magnitude). The current sensor 4 is also configured to generate a sensor signal indicating the current magnitude over a time period during which the current magnitude is measured, and to send the sensor signal to the processing unit 1.

The alert device 5 is configured to deliver an alerting signal that may be an audio alerting signal and/or a visual alerting signal. According to some embodiments, the alert device 5 may include at least one of a light-emitting element (e.g., a light bulb or a light-emitting diode (LED)) for delivering a light message, a monitor for delivering a text message, and a speaker for delivering a sound message, but the disclosure is not limited thereto.

The processing unit 1 is configured to receive the thermal images of the transformer 9 that the thermographic camera 3 captured at different time points (e.g., time points $T_1$, $T_2$, ..., $T_X$, where X is a positive integer) from the thermographic camera 3, and store the thermal images thus received into the storage 2. The processing unit 1 is configured to, for each of the thermal images thus received, obtain a set of image temperature values that includes plural image temperature values respectively related to the plural regions of the thermal image based on temperature information contained in the thermal image. For example, in an embodiment where the thermal images the thermographic camera 3 captured each have three regions such as the first region A1, the second region A2 and the third region A3 as illustrated in FIG. 2, a first image temperature value, a second image temperature value and a third image temperature value corresponding to the first region A1, the second region A2 and the third region A3, respectively, are obtained for each thermal image.

In an embodiment, each of the plural image temperature values (e.g., the first, second or third image temperature value) is obtained by determining a maximum of multiple temperature values represented respectively by multiple pixels located in the respective one of the plural regions (e.g., the first, second or third region A1, A2, A3) of the thermal image. In another embodiment, each of the plural image temperature values is obtained by calculating a mean value of the temperature values represented respectively by the pixels located in the respective one of the plural regions of the thermal image.

The processing unit 1 is also configured to receive the sensor signal that the current sensor 4 generated and that indicates the current magnitude of the current outputted from the transformer 9 over a time period (covering the time points $T_1$, $T_2$, ..., $T_X$) during which the current magnitude was measured. The processing unit 1 is configured to obtain, based on the sensor signal, magnitude values of the current magnitude measured at the different time points (i.e., time points $T_1$, $T_2$, ..., $T_X$ at which the thermal images were captured), and store the magnitude values thus obtained into the storage 2. Accordingly, the magnitude values of the current magnitude are respectively associated with the thermal images in terms of time.

The processing unit 1 may initially train the machine learning model by using training data that are related to the magnitude values which are of the current magnitude and which are respectively associated with M number of thermal images that were captured by the thermographic camera 3 during a training time period, and M number of sets of image temperature values that are obtained respectively for the M number of thermal images, wherein M is a positive integer that corresponds to the number of the thermal images that the thermographic camera 3 captured during the training time period, and wherein the magnitude values include multiple different values. Specifically, the training data includes M-N number of training examples that correspond respectively to M-N number of thermal images that were captured the last among the M number of thermal images, wherein N is a positive integer that is greater than one but less than M. The M-N number of training examples each include multiple inputs and multiple target outputs. The multiple inputs of one training example include N number of sets of image temperature values that are respectively obtained for N number of thermal images that were captured by the thermographic camera 3 immediately before the thermal image corresponding to the training example is being captured, and N+1 number of magnitude values that are associated respectively with the N number of thermal images and the thermal image corresponding to the training example. The multiple target outputs of one training example include the set of image temperature values that is obtained for the thermal image corresponding to the training example. According to some embodiments, the training time period may be six months or longer, and the value of N may correspond to the number of thermal images that the thermographic camera 3 captures during a few hours (e.g., two hours), but the disclosure is not limited thereto.

After the machine learning model has been trained, the processing unit 1 may use the trained machine learning model to obtain predicted normal temperature values of the transformer 9 for each thermal image that is captured after the training time period. Specifically, as shown in FIGS. 5 and 6, the processing unit 1 is configured to, for an object thermal image that is received from the thermographic camera 3 after the training time period, obtain plural normal temperature values that correspond respectively to the plural regions of the object thermal image by using, as inputs to the machine learning model, N number of sets of image temperature values that are obtained for a batch of thermal images that includes N number of the thermal images that were captured by the thermographic camera 3 immediately before the object thermal image is being captured, and N+1 number of the magnitude values that are associated with the object thermal image and the batch of thermal images. For example, continuing with the thermal image that includes the three regions A1-A3 as shown in FIG. 2, the processing unit 1 is configured to obtain a first normal temperature value, a second normal temperature value and a third normal temperature value that correspond respectively to the first region A1, the second region A2 and the third region A3 of the object thermal image.

Then, the processing unit 1 may compare the plural image temperature values that are obtained for the object thermal image respectively with the plural normal temperature values that are obtained for the object thermal image based on their corresponding regions. When any of the image temperature values exceeds a respective one of the normal temperature values by an offset that exceeds a predetermined threshold, the processing unit 1 may instruct the alert device 5 to deliver an alerting signal in order to warn a user or a manager of the transformer 9 of a possible failure of the transformer 9 that might happen in a while. For example, continuing with the aforementioned example of the thermal image of FIG. 2, the processing unit 1 may compare the first image temperature value, the second image temperature value and the third image temperature value that are obtained for the object thermal image respectively with the first normal temperature value, the second normal temperature value and the third normal temperature value, and instruct the alert device 5 to deliver an alerting signal when the first image temperature value exceeds the first normal temperature value by a first offset that exceeds a predetermined threshold, when the second image temperature value exceeds the second normal temperature value by a second offset that exceeds the predetermined threshold, or when the third image temperature value exceeds the third normal temperature value by a third offset that exceeds the predetermined threshold. For example, assuming that the first, second and third image temperature values of the object thermal image are 35° C., 145° C. and 50° C., respectively, and that the first, second and third normal temperature values obtained for the object thermal image are 35.4° C., 140° C. and 49° C., respectively, a first offset of the first image temperature value with respect to the first normal temperature value is −0.4° C., a second offset of the second image temperature value with respect to the second normal temperature value is 5° C., and a third offset of the third image temperature value with respect to the third normal temperature value is 1° C. In this situation, in an embodiment where the predetermined threshold is set to 4° C., the processing unit 1 would instruct the alert device 5 to deliver the alerting signal because the second offset of 5° C. exceeds the 4° C. threshold. According to some embodiments, the processing unit 1 may further instruct the alert device 5 to deliver the alerting signal to indicate a particular region of the transformer 9 that is going to breakdown based on which image temperature value is too high. For example, in the abovementioned situation where the second offset of 5° C. exceeds the threshold of 4° C., the processing unit 1 may instruct the alert device 5 to deliver the alerting signal indicating that the core of the transformer 9 is going to breakdown based on the fact that the second offset exceeds the threshold.

According to some embodiments of the disclosure, the set of image temperature values that the processing unit 1 obtains for each thermal image may include, instead of the plural image temperature values respectively representing the plural regions, a plurality of image temperature values that correspond respectively to all pixels located in the plural regions and that respectively indicate temperature values which are respectively represented by said pixels. For example, if the plural regions (e.g., the first region A1, the second region A2 and the third region A3 as shown in FIG. 2) of each of the thermal images include P (a positive integer greater than three, e.g., forty-eight hundred (4,800)) number of pixels (i.e., the plural regions of the thermal image occupy P number of pixels of the thermal image), the set of image temperature values that the processing unit 1 obtains for an individual thermal image may include P number of image temperature values, and the processing unit 1 may correspondingly obtain, for an individual object thermal image, P number of normal temperature values that correspond respectively to said P number of pixels as the plural normal temperature values. In an embodiment where the set of image temperature values that the processing unit 1 obtains for each thermal image includes the P number of image temperature values that correspond respectively to the P number of pixels, and where the processing unit 1 obtains, for an individual object thermal image, P number of normal temperature values that correspond respectively to the P number of pixels, the processing unit 1 compares, for each of the P number of pixels of the object thermal image, one of the P number of image temperature values that corresponds to the pixel with one of the P number of normal temperature values that corresponds to the pixel. When the processing unit 1 determines that, for any of the P number of pixels, the image temperature value corresponding to the pixel exceeds the normal temperature value corresponding to the pixel by an offset which exceeds the predetermined threshold, the processing unit 1 instructs the alert device 5 to deliver the alerting signal.

Figure 4:
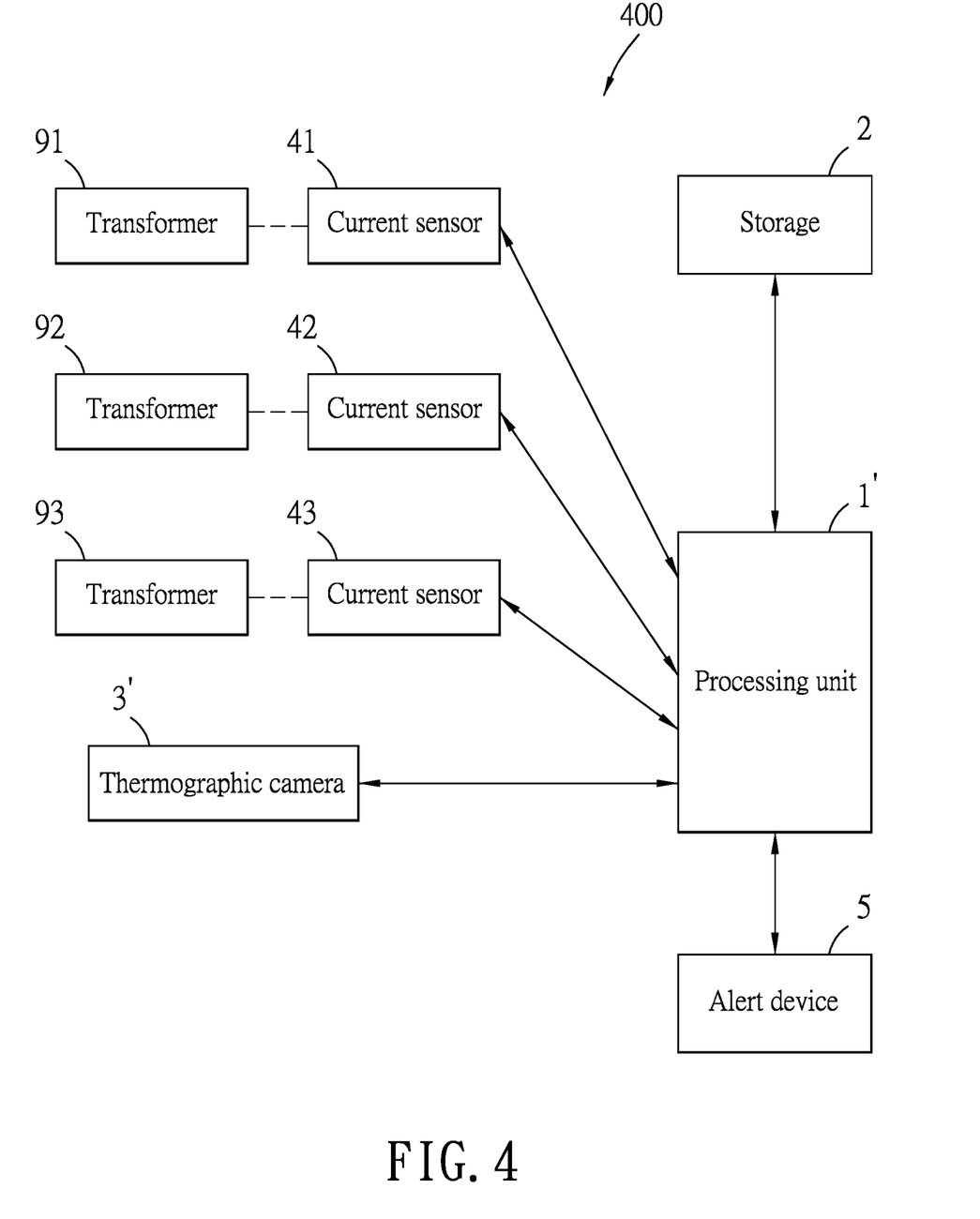
FIG. 4 is a block diagram that exemplarily illustrates an alert system for a three-phase transformer according to an embodiment of the disclosure.

FIG. 4 exemplarily illustrates an alert system 400 for a three-phase transformer (e.g., an RST transformer) that includes a first transformer 91, a second transformer 92 and a third transformer 93 according to an embodiment of the disclosure. The first through third transformers 91-93 each correspond to a different phase of the electricity to be transformed by the three-phase transformer. The system 400 is similar to the system 100 illustrated in FIG. 1, but, in addition to a processing unit 1', a storage 2, a thermographic camera 3', and an alert device 5, includes three current sensors, namely, a first current sensor 41, a second current sensor 42 and a third current sensor 43. The first, second and third current sensors 41, 42, 43 are positioned and configured to continuously measure current magnitudes of currents outputted from the first transformer 91, the second transformer 92 and the third transformer 93, respectively, and generate a first sensor signal, a second sensor signal and a third sensor signal, respectively, that indicate the current magnitudes of the currents outputted from the first transformer 91, the second transformer 92 and the third transformer 93, respectively, over a time period during which the current magnitude is measured. According to some embodiments, the first through third current sensors 41-43 may be respectively implemented by three separate current sensors, or collectively implemented by a three-phase current sensor.

The thermographic camera 3' is positioned facing the first through third transformers 91-93, and is configured to capture thermal images of each of the first through third transformers 91-93 at different time points which are regular intervals (e.g., every thirty seconds) apart, and to send the thermal images thus captured to the processing unit 1'. Specifically, for each of the different time points, the thermographic camera 3' is configured to, at the time point (referred to as an object time point hereinafter), capture a first thermal image of the first transformer 91, a second thermal image of the second transformer 92 and a third thermal image of the third transformer 93, wherein each of the first thermal image, the second thermal image and the third thermal image includes, as mentioned in the above, plural non-overlapping regions corresponding to plural portions of the respective one of the first through third transformers 91-93. For example, each of the first thermal image, the second thermal image and the third thermal image may include a first region corresponding to a main body of the respective one of the first through third transformers 91-93, a second region corresponding to an exposed portion of a core of the respective one of the first through third transformers 91-93, and a third region corresponding to at least one air outlet of the respective one of the first through third transformers 91-93. According to some embodiments, the thermographic camera 3' may include one camera lens for capturing all of the first through third thermal images, or include three camera lenses respectively for capturing the first through third thermal images.

The processing unit 1' is similar to the processing unit 1 in the system 100 as illustrated in FIG. 1, but trains the machine learning model stored in the storage 2 and obtains predicted normal temperature values with a trained machine learning model in a different way.

Specifically, as shown in FIGS. 7 and 8, the processing unit 1' is configured to receive the first through third thermal images from the thermographic camera 3', and store the same into the storage 2. As mentioned in the above with respect to the system 100, similar to the processing unit 1, the processing unit 1' is configured to, for each thermal image among the first through third thermal images, obtain a set of image temperature values which includes plural image temperature values that are determined respectively with respect to the plural regions of the thermal image (based on a maximum or a mean value of temperature values represented by pixels located in each individual region), or that respectively indicate temperature values which are respectively represented by all pixels located in the plural regions.

The processing unit 1' is also configured to receive the first through third sensor signals from the first through third current sensors 41-43, respectively. For each of the first thermal images, the processing unit 1' is configured to obtain a first magnitude value of the current magnitude of the current outputted from the first transformer 91 that was measured at the time point, at which the first thermal image was captured, based on the first sensor signal, and store the first magnitude value thus obtained into the storage 2. For each of the second thermal images, the processing unit 1' is configured to obtain a second magnitude value of the current magnitude of the current outputted from the second transformer 92 that was measured at the time point, at which the second thermal image was captured, based on the second sensor signal, and store the second magnitude value thus obtained into the storage 2. For each of the third thermal images, the processing unit 1' is configured to obtain a third magnitude value of the current magnitude of the current outputted from the third transformer 93 that was measured at the time point, at which the third thermal image was captured, based on the third sensor signal, and store the third magnitude value thus obtained into the storage 2.

The processing unit 1' may initially train the machine learning model by using training data including K number of training examples that correspond respectively to K number of different sets of thermal images, each of which includes a first thermal image, a second thermal image and a third thermal image that were captured by the thermographic camera 3' at a same time point in a training time period (e.g., six months), wherein K is a positive integer that corresponds to the number of the first thermal images, the second thermal images or the third thermal images that the thermographic camera 3 has captured during the training time period. For each of the K number of training examples, the training example includes multiple inputs and multiple target outputs. The multiple inputs included in the training example include the first through third magnitude values respectively associated with the first thermal image, the second thermal image and the third thermal image included in the set of thermal images that corresponds to the training example, and the sets of image temperature values obtained respectively for the first thermal image and the second thermal image included in the set of thermal images that corresponds to the training example. The multiple target outputs included in the training example include the set of image temperature values obtained for the third thermal image included in the set of thermal images that corresponds to the training example.

After the processing unit 1' has trained the machine learning model by using training data including the K number of training examples, the processing unit 1' may use the trained machine learning model to obtain predicted normal temperature values of the third transformer 93 for each third thermal image that is captured after the training time period in order to monitor the third transformer 93. Specifically, the processing unit 1' is configured to, for one of the third thermal images (referred to as an object third thermal image hereinafter) that was captured at the object time point, obtain plural normal temperature values by using, as inputs to the machine learning model, the first magnitude value associated with one of the first thermal images (referred to as an object first thermal image hereinafter) that was captured at the object time point, the second magnitude value associated with one of the second thermal images (referred to as an object second thermal image) that was captured at the object time point, the third magnitude value associated with the object third thermal image, and the sets of image temperature values obtained respectively for the object first thermal image and the object second thermal image. The plural normal temperature values that are obtained for the object third thermal image correspond respectively to the plural image temperature values included in the set of image temperature values which is obtained for the object third thermal image. The plural image temperature values may be determined respectively with respect to the plural regions of the object third thermal image in one embodiment, and may respectively indicate temperature values that are respectively represented by all pixels located in the plural regions of the object third thermal image in other embodiments.

Then, the processing unit 1' may compare the plural image temperature values included in the set of image temperature values that is obtained for the object third thermal image respectively with the plural normal temperature values that are obtained for the object third thermal image, and instruct the alert device 5 to deliver the alerting signal when any of the plural image temperature values exceeds a respective one of the plural normal temperature values by an offset that exceeds the predetermined threshold, similarly to operation of the processing unit 1 of system 100 with respect to the object thermal image.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An alert system for a transformer, the system comprising:
    a thermographic camera configured to capture thermal images of the transformer at different time points which are regular intervals apart, each of the thermal images including a first region that corresponds to a main body of the transformer, a second region that corresponds to an exposed portion of a core of the transformer, and a third region that corresponds to at least one air outlet of the transformer, the first region, the second region and the third region being non-overlapping with each other;
    a current sensor configured to continuously measure current magnitude of a current outputted from the transformer, and generate a sensor signal indicating the current magnitude over a time period during which the current magnitude was measured;
    a storage configured to store a machine learning model;
    an alert device; and
    a processing unit that is electrically connected to said thermographic camera, said current sensor, said storage and said alert device, and that is configured to
        receive the thermal images from said thermographic camera, and store the thermal images into said storage,
        receive the sensor signal from said current sensor, obtain, based on the sensor signal, magnitude values of the current magnitude measured at the different time points which are within the time period and at which the thermal images were captured, and store the magnitude values thus obtained into said storage, and
        for each of the thermal images thus received, obtain a set of image temperature values including a first image temperature value, a second image temperature and a third image temperature with respect to the first region, the second region and the third region of thermal image, respectively, based on temperature information contained in the thermal image;
    wherein said processing unit is further configured to, for an object thermal image of the thermal images received from said thermographic camera,
        obtain a first normal temperature value, a second normal temperature value and a third normal temperature value that correspond respectively to the first region, the second region and the third region of the object thermal image by using, as inputs to the machine learning model, N number of sets of image temperature values that are obtained for a batch of thermal images that includes N number of the thermal images that were captured by said thermographic camera immediately before the object thermal image is being captured, and N+1 number of the magnitude values that are associated with the object thermal image and the batch of thermal images, N being a positive integer greater than 1;
        compare the first image temperature value, the second image temperature value and the third image temperature value obtained for the object thermal image respectively with the first normal temperature value, the second normal temperature value and the third normal temperature value thus obtained; and
        instruct said alert device to deliver an alerting signal under any of circumstances of: the first image temperature value obtained for the object thermal image exceeding the first normal temperature value by a first offset that exceeds a predetermined threshold; the second image temperature value obtained for the object thermal image exceeding the second normal temperature value by a second offset that exceeds the predetermined threshold; and the third image temperature value obtained for the object thermal image exceeding the third normal temperature value by a third offset that exceeds the predetermined threshold.

2. The alert system of claim 1, wherein said processing unit is configured to, for each of the thermal images thus received:
    obtain the first image temperature value by determining a maximum of multiple temperature values represented respectively by multiple pixels located in the first region of the thermal image;
    obtain the second image temperature value by determining a maximum of multiple temperature values represented respectively by multiple pixels located in the second region of the thermal image; and
    obtain the third image temperature value by determining a maximum of multiple temperature values represented respectively by multiple pixels located in the third region of the thermal image.

3. The alert system of claim 1, wherein said processing unit is configured to, for each of the thermal images thus received:
    obtain the first image temperature value by calculating a mean value of multiple temperature values represented respectively by multiple pixels located in the first region of the thermal image;
    obtain the second image temperature value by calculating a mean value of multiple temperature values represented respectively by multiple pixels located in the second region of the thermal image; and
    obtain the third image temperature value by calculating a mean value of multiple temperature values represented respectively by multiple pixels located in the third region of the thermal image.

4. The alert system of claim 1, wherein:
    the object thermal image is captured after a training time period;
    said processing unit is further configured to train the machine learning model by using training data that are related to the magnitude values associated with M number of thermal images that were captured by said thermographic camera during the training time period, and M number of sets of image temperature values that are obtained respectively for the M number of thermal images, M being a positive integer greater than N.

5. The alert system of claim 4, wherein:
the training data includes M-N number of training examples that correspond respectively to M-N number of thermal images that are captured the last among the M number of thermal images; and
for each of the M-N number of training examples, the training example includes multiple inputs and multiple target outputs, the multiple inputs including N number of sets of image temperature values that are respectively obtained for N number of thermal images that were captured by said thermographic camera immediately before the thermal image corresponding to the training example is being captured, and N+1 number of magnitude values that are associated respectively with said N number of thermal images and the thermal image corresponding to the training example, the multiple target outputs including the set of image temperature values that is obtained for the thermal image corresponding to the training example.

6. The alert system of claim 1, wherein said processing unit is configured to:
for each of the thermal images, obtain the set of image temperature values including plural image temperature values that correspond respectively to plural pixels located in the first region, the second region and the third region of the thermal image and that respectively indicate temperature values which are respectively represented by the plural pixels, the plural image temperature values including the first image temperature value that corresponds to a pixel located in the first region, the second image temperature value that corresponds to a pixel located in the second region, and the third image temperature value that corresponds to a pixel located in the third region;
for the object thermal image, obtain plural normal temperature values that correspond respectively to the plural pixels by using, as inputs to the machine learning model, the N number of sets of image temperature values that are obtained for the batch of thermal images and the N+1 number of the magnitude values that are associated with the object thermal image and the batch of thermal images, the plural normal temperature values including the first normal temperature value that corresponds to the pixel located in the first region, the second normal temperature value that corresponds to the pixel located in the second region, and the third normal temperature value that corresponds to the pixel located in the third region.

7. The alert system of claim 6, wherein said processing unit is configured to:
for each of the plural pixels located in the first region, the second region and the third region of the object thermal image, compare one of the plural image temperature values that is included in the set of image temperature values obtained for the object thermal image and that corresponds to the pixel with one of the plural normal temperature values that corresponds to the pixel,
instruct said alert device to deliver an alerting signal when, for any of the plural pixels, one of the plural image temperature values that is included in the set of image temperature values obtained for the object thermal image and that corresponds to the pixel exceeds one of the plural normal temperature values that corresponds to the pixel by an offset which exceeds the predetermined threshold.

8. The alert system of claim 6, wherein:
the object thermal image is captured after a training time period;
the plural pixels located in the first region, the second region and the third region of each of the thermal images includes P number of pixels, P being a positive integer greater than three;
the set of image temperature values that is obtained for each of the thermal images includes P number of image temperature values that correspond respectively to the P number of pixels;
said processing unit is configured to obtain, for the object thermal image, P number of normal temperature values that correspond respectively to the P number of pixels as the plural normal temperature values;
said processing unit is further configured to train the machine learning model by using training data that are related to M number of magnitude values associated respectively with M number of thermal images that are captured by said thermographic camera during the training time period, and M number of sets of image temperature values that are obtained respectively for the M number of thermal images, M being a positive integer greater than N.

9. The alert system of claim 8, wherein:
the training data includes M-N number of training examples that correspond respectively to M-N number of thermal images that are captured the last among the M number of thermal images; and
for each of the M-N number of training examples, the training example includes multiple inputs and multiple target outputs, the multiple inputs including N number of sets of plural image temperature values that are obtained respectively for N number of thermal images that were captured by said thermographic camera immediately before the thermal image corresponding to the training example is being captured, and N+1 number of magnitude values that are associated respectively with said N number of thermal images and the thermal image corresponding to the training example, the multiple target outputs including the set of image temperature values that is obtained for the thermal image corresponding to the training example.

10. An alert system for a three-phase transformer, which includes a first transformer, a second transformer and a third transformer, the system comprising:
a thermographic camera configured to, at an object time point, capture a first thermal image of the first transformer, a second thermal image of the second transformer and a third thermal image of the third transformer, each of the first thermal image, the second thermal image and the third thermal image including a first region that corresponds to a main body of the respective one of the first transformer, the second transformer and the third transformer, a second region that corresponds to an exposed portion of a core of the respective one of the first transformer, the second transformer and the third transformer, and a third region that corresponds to at least one air outlet of the respective one of the first transformer, the second transformer and the third transformer, the first region, the second region and the third region being non-overlapping with each other;
a first current sensor configured to continuously measure current magnitude of a current outputted from the first transformer, and generate a first sensor signal indicating the current magnitude over a time period during which the current magnitude was measured;

a second current sensor configured to continuously measure current magnitude of a current outputted from the second transformer, and generate a second sensor signal indicating the current magnitude over the time period during which the current magnitude was measured;

a third current sensor configured to continuously measure current magnitude of a current outputted from the third transformer, and generate a third sensor signal indicating the current magnitude over the time period during which the current magnitude was measured;

a storage configured to store a machine learning model;

an alert device; and a processing unit that is electrically connected to said thermographic camera, said first current sensor, said second current sensor, said third current sensor, said storage and said alert device, and that is configured to
receive the first thermal image, the second thermal image and the third thermal image from said thermographic camera, and store the first thermal image, the second thermal image and the third thermal image into said storage, receive the first sensor signal, the second sensor signal and the third sensor signal from said first current sensor, said second current sensor and said current sensor, respectively, obtain, based on the first sensor signal, a first magnitude value of the current magnitude measured at the object time point which is within the time period and at which the first thermal image was captured, obtain, based on the second sensor signal, a second magnitude value of the current magnitude measured at the object time points which is within the time period and at which the second thermal image is captured, obtain, based on the third sensor signal, a third magnitude value of the current magnitude measured at the object time point which is within the time period and at which the third thermal image is captured, and store the first magnitude value, the second magnitude value and the third magnitude value into said storage, for each thermal image of the first thermal image, the second thermal image and the third thermal image thus received, obtain a set of image temperature values including a first image temperature value, a second image temperature value and a third image temperature value with respect to the first region, the second region and the third region of the thermal image, respectively, based on temperature information contained in the thermal image;

wherein said processing unit is further configured to, for the third thermal image,
obtain a first normal temperature value, a second normal temperature value and a third normal temperature value that correspond respectively to the first region, the second region and the third region of the third thermal image by using, as inputs to the machine learning model, the first magnitude value associated with the first thermal image, the second magnitude value associated with the second thermal image, the third magnitude value associated with the third thermal image, and the sets of image temperature values obtained respectively for the first thermal image and the second thermal image;

compare the first image temperature value, the second image temperature value and the third image temperature value that are obtained for the third thermal image respectively with the first normal temperature value, the second normal temperature value and the third normal temperature value; and instruct said alarm device to deliver an alerting signal under any of circumstances of: the first image temperature value obtained for the third thermal image exceeding the first normal temperature value by a first offset that exceeds a predetermined threshold; the second image temperature value obtained for the third thermal image exceeding the second normal temperature value by a second offset that exceeds the predetermined threshold; and the third image temperature value obtained for the third thermal image exceeding the third normal temperature value by a third offset that exceeds the predetermined threshold.

11. The alert system of claim 10, wherein said processing unit is configured to, for each thermal image among the first thermal image, the second thermal image and the third thermal image thus received:

obtain the first image temperature value by determining a maximum of multiple temperature values represented respectively by multiple pixels located in the first region of the thermal image;

obtain the second image temperature value by determining a maximum of multiple temperature values represented respectively by multiple pixels located in the second region of the thermal image; and obtain the third image temperature value by determining a maximum of multiple temperature values represented respectively by multiple pixels located in the third region of the thermal image.

12. The alert system of claim 10, wherein said processing unit is configured to, for each thermal image among the first thermal image, the second thermal image and the third thermal image thus received:

obtain the first image temperature value by calculating a mean value of multiple temperature values represented respectively by multiple pixels located in the first region of the thermal image;

obtain the second image temperature value by calculating a mean value of multiple temperature values represented respectively by multiple pixels located in the second region of the thermal image; and obtain the third image temperature value by calculating a mean value of multiple temperature values represented respectively by multiple pixels located in the third region of the thermal image.

13. The alert system of claim 10, wherein:

the object time point is after a training time period;

said processing unit is further configured to train the machine learning model by using training data including K number of training examples that correspond respectively to K number of different sets of thermal images, each of which includes a first thermal image, a second thermal image and a third thermal image that are captured by said thermographic camera at a same time point in the training time period, K being a positive integer;

for each of the K number of training examples, the training example includes multiple inputs and multiple target outputs, the multiple inputs including the first, second and third magnitude values respectively associated with the first thermal image, the second thermal image and the third thermal image included in the set of thermal images that corresponds to the training example, and the sets of image temperature values obtained respectively for the first thermal image and the second thermal image included in the set of thermal images that corresponds to the training example, the multiple target outputs including the set of image temperature values obtained for the third thermal image included in the set of thermal images that corresponds to the training example.

14. The alert system of claim 10, wherein said processing unit is configured to:
for each thermal image among the first thermal image, the second thermal image and the third thermal image, obtain the set of image temperature values which includes plural image temperature values that correspond respectively to plural pixels located in the first region, the second region and the third region of the thermal image and that respectively indicate temperature values that are respectively represented by the plural pixels based on the temperature information contained in the thermal image, the plural image temperature values including the first image temperature value that corresponds to a pixel located in the first region, the second image temperature value that corresponds to a pixel located in the second region, and the third image temperature value that corresponds to a pixel located in the third region; and
for the third thermal image, obtain plural normal temperature values that correspond respectively to the plural pixels and that include the first normal temperature value which corresponds to the pixel located in the first region, the second normal temperature value which corresponds to the pixel located in the second region, and the third normal temperature value which corresponds to the pixel located in the third region.

15. The alert system of claim 14, wherein said processing unit is configured to:
for each of the plural pixels located in the first region, the second region and the third region of the third thermal image, compare one of the plural image temperature values that is included in the set of image temperature values obtained for the third thermal image and that corresponds to the pixel with one of the plural normal temperature values that corresponds to the pixel,
instruct said alert device to deliver an alerting signal when, for any of the plural pixels, one of the plural image temperature values that is included in the set of image temperature values obtained for the third thermal image and that corresponds to the pixel exceeds one of the plural normal temperature values that corresponds to the pixel by an offset that exceeds the predetermined threshold.

16. The alert system of claim 14, wherein:
the object time point is after a training time period;
the plural pixels located in the first region, the second region and the third region of each thermal image among the first thermal image, the second thermal image and the third thermal image includes P number of pixels, P being a positive integer greater than three;
the set of image temperature values that is obtained for each thermal image among the first thermal image, the second thermal image and the third thermal image includes P number of image temperature values that correspond respectively to the P number of pixels;
said processing unit is configured to obtain, for the third thermal image, P number of normal temperature values that correspond respectively to the P number of pixels as the plural normal temperature values;
said processing unit is further configured to train the machine learning model by using training data including K number of training examples that correspond respectively to K number of different sets of thermal images, each of which includes a first thermal image, a second thermal image and a third thermal image that were captured by said thermographic camera at a same time point in the training time period, K being a positive integer;
for each of the K number of training examples, the training example includes multiple inputs and multiple target outputs, the multiple inputs including the magnitude values associated with the first thermal image, the second thermal image and the third thermal image included in the set of thermal images that corresponds to the training example, and the sets of image temperature values obtained respectively for the first thermal image and the second thermal image included in the set of thermal images that corresponds to the training example, the multiple target outputs including the set of image temperature values obtained for the third thermal image included in the set of thermal images that corresponds to the training example.

* * * * *

UNITED STATES PATENT AND TRADEMARK OFFICE
CERTIFICATE OF CORRECTION

PATENT NO. : 11,823,832 B2
APPLICATION NO. : 17/109699
DATED : November 21, 2023
INVENTOR(S) : Shun-Hung Tsai et al.

It is certified that error appears in the above-identified patent and that said Letters Patent is hereby corrected as shown below:

On the Title Page

Delete the title page and substitute therefore with the attached title page.

In the Drawings

Please add FIGS. 5-8 as shown on the attached pages.

Signed and Sealed this
Twentieth Day of February, 2024

*Katherine Kelly Vidal*

Katherine Kelly Vidal
*Director of the United States Patent and Trademark Office*

(12) United States Patent
Tsai et al.

(10) Patent No.: US 11,823,832 B2
(45) Date of Patent: Nov. 21, 2023

(54) ALERT SYSTEM FOR TRANSFORMER

(71) Applicant: National Taipei University of Technology, Taipei (TW)

(72) Inventors: Shun-Hung Tsai, Taipei (TW); Men-Shen Tsai, Taipei (TW); Kuan-Wei Ko, Taipei (TW)

(73) Assignee: NATIONAL TAIPEI UNIVERSITY OF TECHNOLOGY, Taipei (TW)

( * ) Notice: Subject to any disclaimer, the term of this patent is extended or adjusted under 35 U.S.C. 154(b) by 526 days.

(21) Appl. No.: 17/109,699

(22) Filed: Dec. 2, 2020

(65) Prior Publication Data
US 2022/0148799 A1    May 12, 2022

(30) Foreign Application Priority Data
Nov. 11, 2020   (TW) .................................. 109139288

(51) Int. Cl.
| | | |
|---|---|---|
| *H01F 27/40* | (2006.01) | |
| *G01R 31/62* | (2020.01) | |
| *G01J 5/02* | (2022.01) | |
| *G08B 21/18* | (2006.01) | |
| *G06N 20/00* | (2019.01) | |
| *G01J 5/53* | (2022.01) | |

(Continued)

(52) U.S. Cl.
CPC ............ *H01F 27/402* (2013.01); *G01J 5/027* (2013.01); *G01J 5/53* (2022.01); *G01R 31/62* (2020.01); *G06N 20/00* (2019.01); *G08B 21/182* (2013.01); *G08B 21/185* (2013.01); *G08B 21/187* (2013.01); *G01J 5/48* (2013.01); *G01J 2005/0077* (2013.01); *H01F 2027/406* (2013.01)

(58) Field of Classification Search
CPC .. H01F 27/402; H01F 2027/406; G01J 5/027; G01J 5/53; G01J 5/48; G01J 2005/0077; G01J 5/0096; G01J 5/52; G01R 31/62; G06N 20/00; G08B 21/182; G08B 21/185; G08B 21/187
See application file for complete search history.

(56) References Cited

U.S. PATENT DOCUMENTS

| | | | | |
|---|---|---|---|---|
| 9,948,872 | B2 * | 4/2018 | Frank ...................... | H04N 23/57 |
| 10,670,572 | B2 * | 6/2020 | Chadha .............. | G01N 15/0656 |
| 11,497,405 | B2 * | 11/2022 | Abreu ..................... | A61B 5/002 |

(Continued)

FOREIGN PATENT DOCUMENTS

| | | |
|---|---|---|
| TW | I676009 B | 11/2019 |
| TW | M595226 U | 5/2020 |

*Primary Examiner* — Tung S Lau
(74) *Attorney, Agent, or Firm* — Birch, Stewart, Kolasch & Birch, LLP

(57) ABSTRACT

An alert system for a transformer includes a thermographic camera configured to capture thermal images of the transformer, a current sensor configured to generate a sensor signal indicating the current magnitude of a current outputted from the transformer, a storage configured to store a machine learning model, an alert device, and a processing unit configured to obtain image temperature values from the thermal images, obtain magnitude values from the sensor signal, obtain normal temperature values by using the machine learning model and the magnitude values, and instruct the alert device to deliver an alerting signal based on a result of comparison between the image temperature values and the normal temperature values.

16 Claims 8 Drawing Sheets

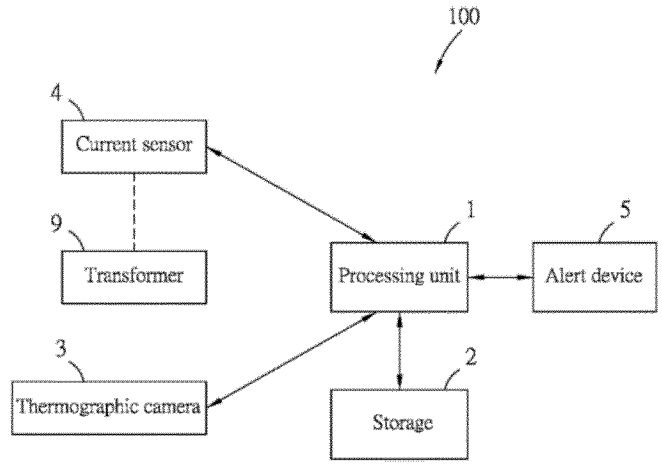

Receive an object thermal image of the transformer captured by the thermographic camera, the object thermal image including a first region, a second region and a third region Obtain magnitude values of the current magnitude of a current outputted from the transformer measured by the current sensor Obtain a first image temperature value for the first region, a second image temperature value for the second region, and a third image temperature value for the third region Input N number of sets of image temperature values obtained for N umber of thermal images that were captured by the thermographic camera immediately before the object thermal image is being captured, into the machine learning model Input N+1 number of magnitude values associated respectively with the N number of thermal images and the object thermal image, into the machine learning model Obtain a first normal temperature value for the first region, a second normal temperature value for the second region, and a third normal temperature value for the third region

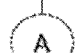

FIG. 5

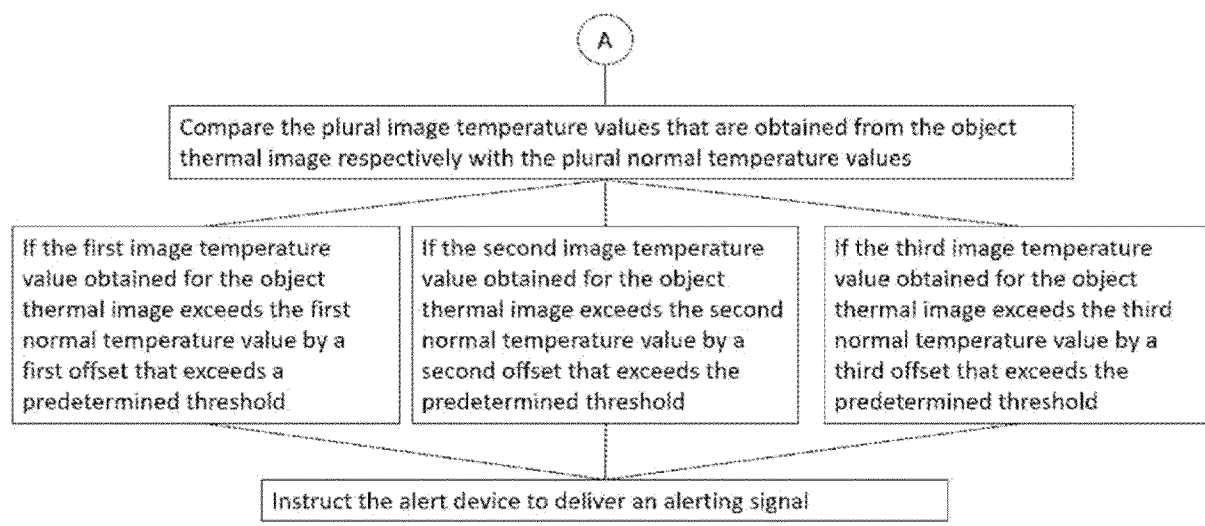
FIG. 6

Receive a first thermal image of the first transformer, a second thermal image of the second transformer and a third thermal image of the third transformer captured by the thermographic camera, each of the first thermal image, the second thermal image and the third thermal image including a first region, a second region and a third region Obtain a first magnitude value, a second magnitude value and a third magnitude value of the current magnitudes of the currents outputted from the first, second and third transformers respectively measured by a first current sensor, a second current sensor and a third current sensor Obtain a first image temperature value for the first region, a second image temperature value for the second region, and a third image temperature value for the third region for each thermal image of the first thermal image, the second thermal image and the third thermal image Input the first magnitude value associated with the first thermal image, the second magnitude value associated with the second thermal image, the third magnitude value associated with the third thermal image, into the machine learning model Input the sets of image temperature values obtained respectively for the first thermal image and the second thermal image, into the machine learning model Obtain a first normal temperature value, a second normal temperature value and a third normal temperature value that correspond respectively to the first region, the second region and the third region of the third thermal image

FIG. 7

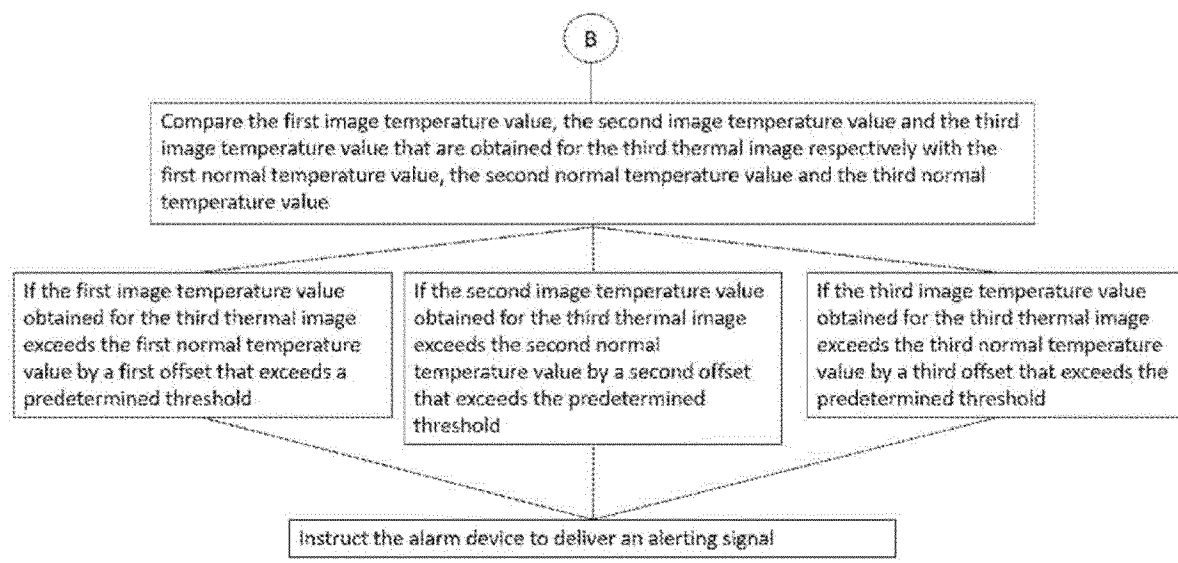
FIG. 8